(12) United States Patent
DeFelice et al.

(10) Patent No.: US 6,190,940 B1
(45) Date of Patent: Feb. 20, 2001

(54) FLIP CHIP ASSEMBLY OF SEMICONDUCTOR IC CHIPS

(75) Inventors: Richard Alden DeFelice, Bernardsville; Eric William Dittmann, Califon; Paul A. Sullivan, Summit, all of NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/235,011

(22) Filed: Jan. 21, 1999

(51) Int. Cl.⁷ .................................................. H01L 21/44
(52) U.S. Cl. .......................................... 438/106; 257/737
(58) Field of Search ..................................... 438/106, 107, 438/108, 118, 119, 612, 613; 257/778, 779, 780, 737

(56) References Cited

U.S. PATENT DOCUMENTS 5,341,564 * 8/1994 Akavain et al. ........................ 29/832
5,952,718 * 9/1999 Ohtsuka et al. ..................... 257/737

* cited by examiner

Primary Examiner—David Nelms
Assistant Examiner—David Vu
(74) Attorney, Agent, or Firm—Peter V. D. Wilde; Thomas, Kayden, Horstemeyer & Risley LLP

(57) ABSTRACT

The specification describes techniques for soldering IC chips, or other components, to interconnection substrates using a patterned epoxy layer to define the solder interconnections. The epoxy layer is photodefined to form openings that expose the bonding sites on the IC chip (or alternatively the interconnect substrate). Solder paste is deposited in the openings. With the IC chip and the interconnect substrate aligned together, the solder paste is heated to reflow the solder and solder bond the IC chip to the substrate. Heating is continued to cure the epoxy, which serves the function of the conventional underfill. The shape of the solder interconnection is defined by the lithographically formed openings, and the interconnections can be made with very fine pitch. The application of the epoxy underfill in this manner assures complete filling of the gap between the IC chip and the interconnection substrate.

11 Claims, 2 Drawing Sheets

FLIP CHIP ASSEMBLY OF SEMICONDUCTOR IC CHIPS

FIELD OF THE INVENTION

This invention relates to processes for assembling electronic device components using flip-chip techniques, and more particularly to the assembly of semiconductor IC packages with fine pitch bonding sites.

BACKGROUND OF THE INVENTION

State of the art semiconductor integrated circuit (IC) packages are typically high density interconnection structures in which typically unpackaged IC chips or bare die are connected both mechanically and electrically onto a substrate of silicon, ceramic, or epoxy-glass laminate. The choice of interconnection technique, substrate material, and bonding process steps, all play significant roles in defining the overall assembly technique and its influence on IC package cost and reliability. A variety of interconnection techniques have been used in the microelectronics industry to assemble bare die onto the interconnect substrates. These substrates function as both structural support and as the "fabric" for the electrical interconnections between ICs.

Typically, semiconductor IC packages are assembled using one of a variety of known techniques, e.g. wire bonding, tape automated bonding (TAB), and flip-chip soldering. In general, the design of the IC package depends on the particular capabilities of the manufacturer, the IC package architecture, the relative cost of materials, and the required I/O configuration and density. In turn, the choice of interconnection technique plays a major role in defining the assembly process required for high yield and product reliability.

The most common, and nominally the lowest cost, interconnection technique is wire bonding. However, wire bond connections have the disadvantage of having a large footprint, which results in a large substrate and a necessarily less compact package. As is well known in electronics manufacturing, increased size of any feature in the assembly translates directly into added cost. Moreover, increasing the size of the package increases the length of interconnects, leading to increased lead inductance and resistance, and a degradation in electrical performance. Furthermore, a typical wire bonding apparatus, e.g. a stitch bonder, makes bonds one at a time, a time consuming operation even with advanced high speed bonders currently available.

TAB bonding has the advantages of both a smaller footprint and of partial batch processing. However, TAB assembly generally requires different tooling for each IC design, adding significant cost to this bonding technique. Moreover, TAB assembly is limited to interconnection of perimeter I/O arrays thus limiting the IC design flexibility. Perimeter I/O pads typically have higher pitches and correspondingly lower overall I/O densities than the area I/O arrays that can be used with flip-chip solder bonding. Also TAB bonded interconnections typically show higher capacitance and greater parasitic inductance than flip-chip bonded interconnections.

As has long been recognized, flip-chip bonding provides the best performance at the highest I/O density for either perimeter or area I/O arrays. Furthermore, flip-chip bonding is inherently a batch assembly process which facilitates high speed, high through-put manufacture. Flip-chip packaging is a dominant technology especially in the manufacture of computers and computer peripherals. It is also widely used in the assembly of electronics and photonics packages for communication networks products. The essence of flip-chip assembly is the attachment of semiconductor substrates "upside down" on an interconnection substrate such as a silicon wafer, ceramic substrate, or printed circuit board. The attachment means is typically solder, in the form of balls, pads, or bumps (generically referred to hereinafter as bumps). The solder bumps may be applied to the semiconductor chip, or to the interconnection substrate, or to both. The chip is placed in contact with the substrate and the solder is heated to reflow the solder and attach the chip to the substrate. The solder bonds form pillars or beams that offset the joined surfaces with respect to one another leaving a gap therebetween. After the chip is bonded to an interconnection substrate the resulting assembly typically undergoes further thermal cycling during additional assembly operations. The final product also is exposed to wide temperature changes in the service environment. The chip package is typically a semiconductor, and the interconnection substrate may be epoxy, ceramic, or an epoxy-glass laminate. The material of the chip, and the material of the interconnection substrate, have thermal expansion coefficients that are different from one another. The differential expansion that the assembly invariably undergoes results in stresses on the solder bonds which can cause stress cracking and ultimately failure of the electrical path through the solder bond. To avoid solder bond failures due to mechanical stress, the gap between the surfaces joined by the bond is typically filled with an underfill material. The underfill provides additional mechanical strength for the assembly and also protects the gap from moisture and other corrosive contamination. Underfill materials are adhesive and water insoluble. They are typically epoxy materials.

The underfill is applied after completion of the solder bonding operation. The underfill material is typically a polymer and is applied as a prepolymer liquid. Consequently, the viscosity of the underfill material as it is dispensed into the gap should be relatively low. The liquid prepolymer flows freely into the gap and, due to the relatively small gap in state of the art packages, flow is aided substantially by surface tension, and the liquid prepolymer is "wicked" into the gap. However, in some cases entrapped air, or incomplete wetting of the surfaces of the space being filled, inhibits flow or prevents wicking, causing voids in the underfill. A technique for overcoming this problem is described in patent application Ser. No. 08/956,527, filed Oct. 23, 1997, and assigned to the same assignee as this application. The technique described and claimed in the prior application involves coating one or both of the elements being bonded with epoxy and thermocompression bonding them together so that the solder bumps penetrate the epoxy layer. The epoxy is cured as the bump bonds are effected. In this way complete coating of the surfaces being bonded, and complete filling of the gap therebetween, is assured.

For a variety of reasons, flip-chip assembly is usually considered to be the most expensive of the known assembly techniques. This is especially true for "high performance" IC package designs which often use multi-layer co-fired ceramics (MCM-C) or deposited thin film ceramic or silicon substrates (MCM-D) as the interconnection substrate. The less expensive alternative is a typical printed wiring board, i.e epoxy-glass fiber laminate. However, as the I/O count and density increases in epoxy-glass fiber laminates, the solder bumps typically used for interconnection are too closely spaced and frequently bridge together. This is partly due to the fact that the formation of solder bumps relies on surface tension to create ball shaped solder bodies at the interconnection site. Lateral flow of solder during this process is unconstrained, and lateral flow sometimes exceeds the desired boundaries leading to bridging to the adjacent ball or pad.

The foregoing problems are especially severe in microbumped packages, in which the bump height is so small that the small gap resulting after the bonding operation cannot be filled consistently by relying only on fluid dynamics, and voids are frequent. The bump bond pitch in these packages is also very small, resulting in solder bumps melting together and shorting.

STATEMENT OF THE INVENTION

We have developed an underfill technique for solder bonded assemblies that does not rely on wicking or fluid flow for filling the gap between the solder bonded surfaces. According to this technique a layer of epoxy underfill material is applied to one or both surfaces prior to solder bonding, and the epoxy layer is patterned to form openings over the bonding pads. Solder paste is then applied to the patterned epoxy layer to fill the openings over the bonding pads. The surfaces are placed in contact and the solder paste is reflowed. The reflowed solder is molded and confined laterally by the patterned epoxy layer. As the solder paste consolidates to molten solder, the epoxy wets and bonds to both surfaces. This prevents bridging between adjacent solder bumps. The heating step for solder reflow is continued to fully cure the epoxy layer. Because the underfill material is applied to a free and open surface, a variety of application techniques can be used which ensure complete filling of the gap between the IC chip and the interconnect substrate.

DETAILED DESCRIPTION

Figure 1:
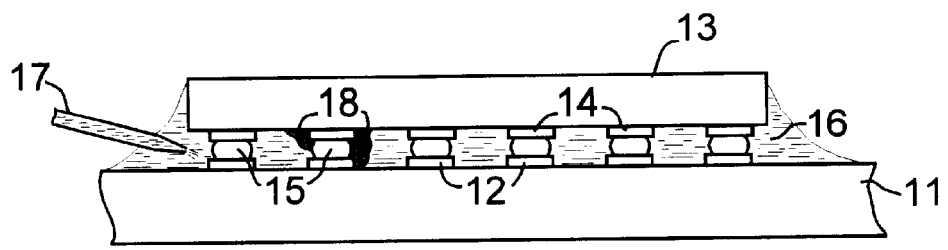
FIG. 1 is a schematic view of a conventional interconnection substrate and solder bumped flip chip.

Referring to FIG. 1, an interconnection substrate 11 is shown with bonding sites 12 on the interconnection substrate. It should be understood that the features shown in the figures are not to scale, and are for convenience in illustration. The interconnection substrate 11 is cut away to indicate that the portion shown is part of a larger substrate that may contain other chips or components. The interconnection substrate may be a standard epoxy board, a ceramic substrate, or a silicon interconnection substrate. The substrate may be single or multilevel, and the bonding sites are formed by conventional means. The bonding sites on a standard laminate board are typically copper pads.

Shown above the interconnection substrate is an IC chip 13, solder bump bonded to the interconnection substrate. The IC chip has an array of bonding sites 14, which are typically aluminum pads coated with under bump metallization (UBM). The IC chip and the interconnection substrate are attached by solder bumps 15. The bonding sites for the solder bumps may be at the edge of the chip, or may comprise an area array over a substantial portion of the chip. The solder bumps are typically formed on the surface of the IC chip, i.e. the side with the IC metallization, and the chip is "flipped" as shown for bonding to the interconnection substrate 11. It is possible to reverse this arrangement and locate the solder bumps on the substrate, or to have solder bumps or solder pads on both surfaces. The embodiment shown in FIG. 1 is typical, and preferred.

The term bump as used in this description is intended to mean solder bodies of whatever shape or description known and used in the art that join one surface to another leaving a gap between the joined surfaces. Solder bumps take a variety of forms and may be applied by a variety of techniques known in the art. The IC chips typically comprise semiconductor devices such as memory or logic chips, or photonic devices such as LEDs, lasers, modulators, detectors, etc. The semiconductor is usually silicon although GaAs or InP substrates may be used for photonic ICs.

For illustrating this invention the solder interconnections are shown between an IC chip and an interconnection substrate. As is well known in the art, solder bump arrays, including both edge arrays and area arrays, are used for interconnecting elements in a variety of electronic or photonic assemblies. For example, a common arrangement is to bond one or more chip packages to an intermediate interconnection substrate, and to solder bump bond the intermediate interconnection substrate to a system interconnection substrate. While it is unnecessary to illustrate each known electronic package that uses solder bump bonding, it should be understood that this invention is applicable to any such package in which two essentially planar surfaces are joined mechanically and electrically by solder. It should also be understood at the outset, that while the interconnections described are customarily thought of as solder bumps, and the interconnection process as solder bump bonding, in the preferred embodiment of this invention, actual solder bumps are not formed. The solder attachment is made directly using solder paste. The final product will resemble a solder bump bonded assembly, but is reached by a more direct process to be described below.

As used herein the term IC chip is equivalent to single chip IC packages, multiple chip packages, and multiple packages of single or multiple chips, i.e. multi-chip modules and combinations of multichip modules installed on an interconnection substrate.

The pitch of the contact pads in current technology is typically of the order of 50–200 $\mu$m and the spacing between pads may be 20–50 $\mu$m. The solder interconnections are typically 25–150 $\mu$m in height (z-direction). The device package is usually square or rectangular with sides typically in the 2–50 mm range. The continuing trend is toward ever finer pitch packages, and so-called micro-bump arrays may have a pitch in the range 10–30 $\mu$m and solder bump height of 3–25 $\mu$m.

After solder bump bonding IC chip 13 to interconnect substrate 11, the gap between them is filled with epoxy underfill 16. The underfill applicator is schematically represented by epoxy dispenser 17. The epoxy is applied as a low viscosity fluid that flows or "wicks" into the gap as shown in FIG. 1. This epoxy underfill (after curing to a rigid state) serves to mechanically strengthen the assembly and compensate for differential thermal expansion between the IC chip and the interconnect substrate. This difference is typically of the order of 10 to 15 ppm/° C. The epoxy underfill, if strongly adhered to all surfaces, prevents or resists differential expansion and increases the lifetime of the solder interconnections. Defects arise when voids occur in the underfill, as represented at 18 in FIG. 1. This creates a focus point for strain relief of the differential stresses in the assembly, and causes failure of the solder bonds at or near this point. It also allows moisture or other corrosive agents in the ambient to reach the solder bond and cause corrosion failures.

The sequence of processing steps used according to the invention to improve the underfill process, and to provide lateral confinement and thus more precise positioning of solder interconnections, will be described in conjunction with FIGS. 2–8.

Figure 2:
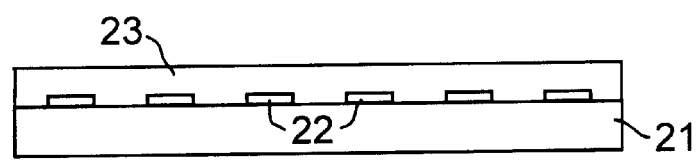
FIGS. 2–8 are schematic views representing process steps for forming a flip-chip assembly according to the invention.

In FIG. 2, IC chip 21 is shown with solder bump sites 22. The IC chip is coated with an epoxy layer 23. The preferred epoxy material is a UV curable epoxy that can be photodefined as will be described below. An example is Luxtrak™ 4021 manufactured by Ablestik. These materials, and their cure properties have been investigated thoroughly, and are used widely as coating materials for a variety of products, e.g. sheet goods, optical fibers, etc. The thickness of the epoxy layer is made to approximate the height of the solder interconnections to be formed later. This dimension is approximately the standoff desired between the IC chip and the interconnection substrate.

The epoxy material is then preferably pre-baked, i.e. partially cured, to form a semi-rigid layer, and then patterned to form openings over the bonding sites. Since the epoxy material is UV curable, the preferred patterning technique is to use a UV stepper, a standard lithographic tool in conventional IC processing. Since the mask requirements for the dimensions involved are relatively undemanding, other exposure tools can also be used, e.g. shadow masks. Standard photoresist techniques can be used. The partial cure can be implemented using UV light, or can be a brief thermal treatment. For example, a treatment of 30% to 50% of the recommended manufacturer's cure time will be suitable for this step.

Figure 3:
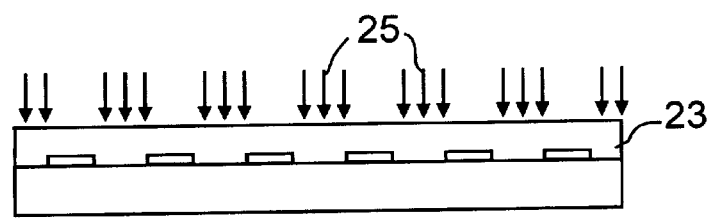
Figure 4:
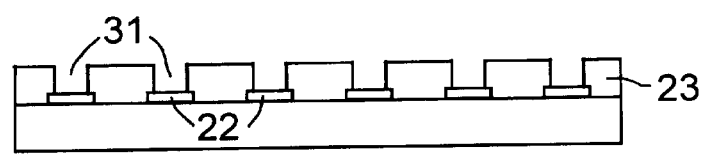
Figure 5:
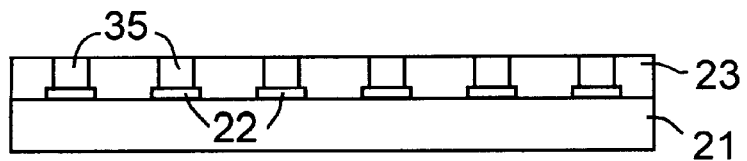
Figure 6:
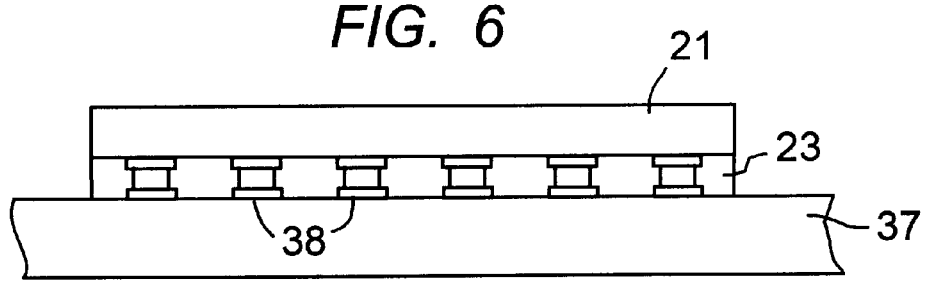

As represented in FIG. 3, the epoxy layer 23 is exposed to a pattern of UV radiation, represented at 25, to partially cross-link the epoxy. This partial exposure is sufficient to render the exposed portions of the epoxy relatively insoluble in an appropriate solvent, e.g. acetone or methyl ethyl ketone. The layer 23 is then rinsed with the solvent to remove the epoxy in the regions 31 over the bonding pads as shown in FIG. 4. Solder paste 35 is then applied with a squeegee, as shown in FIG. 5 to fill the openings 31 over the bonding sites. The chip is then flipped into position for flip-chip bonding as shown in FIG. 6, and the solder interconnections effected by heating the assembled IC chip and interconnection substrate. The bonding temperature depends on the solder paste used, but is typically in the range 170–220° C. Conveniently, this temperature range also is effective for curing the epoxy underfill material. Because the assembly can be bonded and the underfill cured in essentially a single heating operation, the conventional separate heating step for curing the underfill can be eliminated. Not only does this reduce processing time and cost, but it reduces the thermal cycling of the assembly, and thus reduces the potential for damage due to the thermal effects mentioned above.

It will be appreciated that the viscosity of the underfill material when applied to the interconnection substrate prior to bonding is considerably less critical than when the wicking action described earlier is required for effective underfilling. Thus the underfill material can be applied at essentially any temperature that is convenient and provides effective coating of the substrate. It will also be evident that by reducing the demands on the properties of the underfill material a wider choice of materials is available. Typically the underfill material is a UV curable thermosetting polymer. These polymers are also curable thermally as suggested by the sequence of steps described above. As it is not required that the underfill material be applied as a low viscosity fluid, sheets of partially cured prepolymer material may be useful in some of the processes described here.

It will be understood by those skilled in the art that the epoxy layer 23 in FIG. 5 serves not only to define the perimeter of the solder paste upon application of the paste, as suggested by FIG. 5, but also to confine the solder paste and the reflowed solder during the reflow step represented by FIG. 6. As a consequence, the solder bumps can be more closely spaced, and solder bump bonding becomes more effective at pitches smaller than would be otherwise used.

With reference to the bonding operation of FIG. 6, and the reflow step, the height of the solder ball will be less than the height of the solder paste that fills the openings in the epoxy layer. This insures that the epoxy layer will be in contact with the surface of the interconnect substrate, and adhere thereto, prior to complete curing. The epoxy will also shrink somewhat during curing. It may to be advantageous to apply slight pressure, e.g. 1–5 mg/$\mu$m, to urge the substrate and the IC chip together during the cure operation. The heating step used to effect the combined solder reflow and epoxy curing will be substantially longer than that used in conventional solder bump reflow steps. Accordingly it is useful to have the epoxy confining layer present to retain the molten solder in place during the heating step. Typically the duration of the heating step will be 5–20 minutes.

The interconnection substrate 37 (FIG. 6) may be a single level or a multilevel structure. The interconnection metallization pattern on the interconnection substrate (not shown) is typically covered with a dielectric layer with windows to contact regions 38. The dielectric layer is typically polyimide but may be $SiO_2$ or other suitable dielectric. The IC chip 21 is typically a semiconductor substrate covered with a dielectric layer (not shown), usually $SiN_x$ caps or other suitable capping material. These details are well known.

The IC chip is adapted for flip chip bonding by applying under bump metallization (UBM) on the bonding sites 22. If the interconnect substrate is silicon, with aluminum metallization patterns, similar UMB may be applied to the contact windows on the substrate. The metal or metals used for UBM can be chosen from a variety of materials with the requisite properties. The UBM must adhere well to the material of contact pads, must be wettable by typical tin solder formulations, and be highly conductive. A structure meeting these requirements is a composite of chromium and copper typically approximately 0.5 $\mu$m thick. Chromium is deposited first, to adhere to the contact pad, and copper is applied over the chromium to provide a solder wettable surface. Chromium is known to adhere well to a variety of materials, organic as well as inorganic. Accordingly it adheres well to dielectric materials, e.g. $SiO_2$, SINCAPS, polyimide, etc., commonly used in IC processing, as well as to metals such as copper and aluminum. However, solder alloys dissolve copper and de-wet from chromium. Therefore, a thin layer of copper directly on chromium will dissolve into the molten solder and then the solder will de-wet from the chromium layer. To insure interface integrity between the solder and the UBM, a composite or alloy layer of chromium and copper is typically used between the chromium and copper layers. Alternative composite layer UMB systems are Ti/Ni, Ti/Ni/Au, and Cr/Pt, or a graded alloy of Cr/Cu.

While the technique described above for placing the solder bumps on the bonding sites uses solder paste, and is preferred in the context of the process as described, other solder application methods may also be employed. For example, the pre-baked epoxy layer can be coated with a photoresist, which is then patterned to define the areas of epoxy to be removed. After patterning of the epoxy layer, solder can be evaporated onto the structure, filling the holes in the epoxy layer and coating the top of the photoresist layer. The offset between the surfaces of these regions then allows removal of unwanted solder by conventional lift-off.

The thickness of a typical solder interconnection for this application, i.e. the offset of the chip on the board, is 3–20 µm. The thickness of the solder paste layer, and the thickness of the partially cured epoxy layer, should be larger than the desired offset (minus the thickness of the UBM layers) to account for consolidation of the solder paste during reflow. Using the technique of the invention, it is possible to control the height of the solder interconnection with greater precision. In the formation of conventional solder bumps, the solder is free to flow out in the lateral dimension. The height of the bump is significantly influenced by the degree of lateral flow. The extent of lateral flow depends on several variables. Temperature variations on the board will cause variations in visocsity of the solder and consequent variations in lateral flow. Variations in the wetting properties at the various bonding sites will also influence the width and height of the solder ball. According to the invention the outflow of the solder upon consolidation of the solder paste is confined by the epoxy layer. The width of the solder interconnection, and the resultant height of the solder, will be determined by the precision of the dimensions of the lithographically formed openings, which can be closely controlled.

Examples of solder compositions that can be used successfully in the processes described here are:

|    | I  | II | III |
|----|----|----|-----|
| Sn | 5  | 63 | 95  |
| Pb | 95 | 37 | 0   |
| Sb | 0  | 0  | 5   |

Other solder materials, such as In and In alloys, gold plated tin, etc. can also be used in the techniques described here. Typical melting temperatures are in the range 170° C.–220° C. Heating may be carried out using heated inert gas.

It should be evident that other solder materials can also be used in the technique described, such as In and In alloys, gold plated tin, etc.

In the foregoing sequence of process steps, the solder paste is described as being deposited on the IC chip. Alternatively, the solder paste can be deposited initially on the contact windows on the interconnection substrate. In some cases it may be desirable to form solder paste on both of the surfaces to be joined. It may also be advantageous to join a component that already has a solder bump array, to a component that has an epoxy layer and solder paste array as described above.

Figure 7:
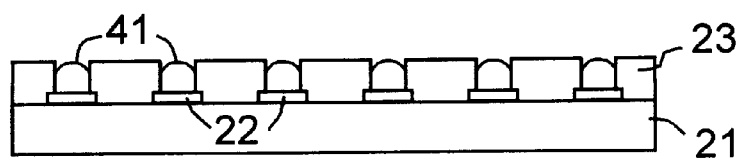

In the case where epoxy layers are formed on both surfaces to be joined, the epoxy layer on both of these surfaces can be patterned as described earlier. Alternatively, one surface can be simply coated with a thin layer of epoxy without patterning. Following this approach, the reflowed solder formed by the solder paste as described earlier is allowed to solidify before the IC chip is applied to the substrate. This is illustrated in FIG. 7, where solder bumps 41 are formed in the windows of the epoxy layer 23 by reflow prior to assembling the IC chip and the board together. The epoxy may be either partially cured, or fully cured, at this point. This bumped IC chip may be saved for later assembly, and is itself a useful article of manufacture.

Figure 8:
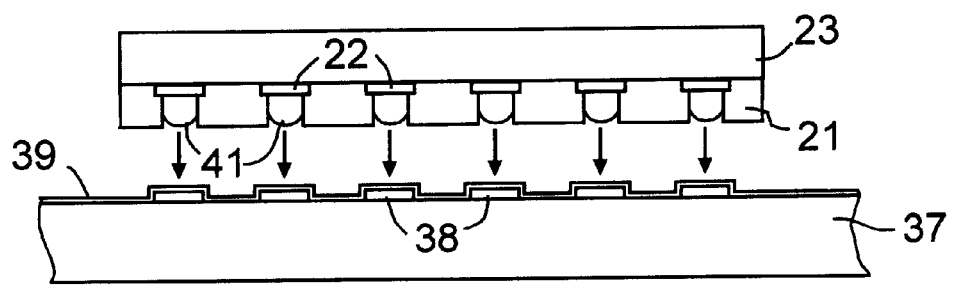

An embodiment showing assembly of the bumped IC chip of FIG. 7 to an interconnection substrate 37 is shown in FIG. 8. The bonding sites 38 on the interconnection substrate are shown coated with a layer of epoxy 39 to ensure wetting of the substrate with epoxy. The bump bond is then effected by urging the parts together, as shown by the arrows, so that the bumps penetrate and displace the thin epoxy layer 39 and contact the metal bonding sites 38. The epoxy layer 39 is optional. In this process, the epoxy may be partially cured during the solder reflow step (FIG. 7), and fully cured after the IC chip is mounted on the interconnect substrate. It should be evident that the IC chip and the interconnect substrate can serve reverse roles. An aspect of this process is similar to that described in the patent application referenced earlier which contains more details on its implementation.

In the normal practice of the invention described the epoxy underfill material will be a polymer and will be applied to the IC chip or the interconnection substrate (or both) as a prepolymer. The term prepolymer is intended to include both uncured and partially cured polymers.

In the foregoing processes, it may be advantageous for the reflow of the solder bumps and the thermal curing of the epoxy to take place at different temperatures. In this case the heating step is bi-modal, i.e. has at least two different temperatures, one to reflow the solder, and another to fully cure the epoxy. Thus it can be envisioned that the heating step is: 190° C. for one minute to reflow the solder, and 175° C. for 15 minutes to fully cure the epoxy.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for the manufacture of semiconductor integrated circuits (ICs) in which a first surface is bonded to a second surface by solder interconnections, said first surface having a first pattern of bonding sites and said second surface having a second pattern of bonding sites that is a mirror image of said first pattern, said solder interconnections formed by the sequential steps of:

a. applying a layer of epoxy over said first surface and over said first pattern of bonding sites,
   b. forming a plurality of openings in said epoxy layer to expose said first pattern of bonding sites,
   c. depositing solder paste in said plurality of openings,
   d. aligning said second surface to said first surface with said second surface in contact with said layer of epoxy and said second pattern of bonding sites aligned with said plurality of openings, and
   e. heating said first and second surfaces to reflow said solder paste and cure said epoxy layer, thereby bonding said first and second surfaces together.

2. The method of claim 1 in which the said layer of epoxy comprises a photodefinable polymer, and said plurality of openings are formed by exposing selected regions of said layer of epoxy to light.

3. The method of claim 2 wherein the light is UV light.

4. The method of claim 3 in which selected regions of said layer of epoxy are exposed to light using a UV stepper.

5. The method of claim 1 in which the heating step comprises heating the solder paste to a first temperature to reflow the solder paste, and heating the epoxy layer to a second temperature to cure the epoxy, said first temperature being higher than said second temperature.

6. The method of claim 1 in which the first surface is the surface of an IC chip.

7. The method of claim 1 in which the second surface is the surface of an interconnection substrate.

8. The method of claim 1 in which the first surface is the surface of an interconnection substrate.

9. The method of claim 1 in which the interconnection substrate is selected from the group consisting of epoxy printed circuit boards, ceramic interconnection substrates and silicon interconnection substrates.

10. The method of claim I wherein the solder paste is heated to a temperature in the range 170–220° C.

11. The method of claim 1 wherein the step of heating said first and second layers comprises heating for at least 5 minutes.

* * * * *